(12) United States Patent
Stojanovic et al.

(10) Patent No.: US 8,466,713 B2
(45) Date of Patent: Jun. 18, 2013

(54) PHASE DETECTION METHOD AND PHASE DETECTOR

(76) Inventors: Nebojsa Stojanovic, Munich (DE); Theodor Kupfer, Feucht (DE); James Whiteaway, Sawbridgeworth (GB); Jurgen Hauenschild, Bochum (DE); Soeren Gehrke, Nuremberg (DE)

( * ) Notice: Subject to any disclaimer, the term of this patent is extended or adjusted under 35 U.S.C. 154(b) by 0 days.

(21) Appl. No.: 13/266,281

(22) PCT Filed: May 3, 2010

(86) PCT No.: PCT/EP2010/055985
§ 371 (c)(1),
(2), (4) Date: Oct. 26, 2011

(87) PCT Pub. No.: WO2010/130596
PCT Pub. Date: Nov. 18, 2010

(65) Prior Publication Data
US 2012/0068748 A1   Mar. 22, 2012

(30) Foreign Application Priority Data

May 12, 2009   (EP) .................................... 09160054

(51) Int. Cl.
*H03D 13/00*   (2006.01)
(52) U.S. Cl.
USPC ................................................ 327/2; 327/3
(58) Field of Classification Search
USPC .................................................. 327/2, 3, 12
See application file for complete search history.

(56) References Cited

U.S. PATENT DOCUMENTS

| 5,592,125 | A  | * | 1/1997  | Williams ...................... 331/1 A |
| 6,538,475 | B1 | * | 3/2003  | Johansen et al. ................ 327/12 |
| 6,822,483 | B1 | * | 11/2004 | Fu et al. ........................... 327/2 |
| 7,068,086 | B2 | * | 6/2006  | Takeda .......................... 327/161 |
| 2003/0219090 | A1 | | 11/2003 | Baba |
| 2009/0074123 | A1 | | 3/2009  | Hsueh et al. |

FOREIGN PATENT DOCUMENTS

| EP | 1494413 A1 | 1/2005 |
| WO | 03079554 A2 | 9/2003 |
| WO | 2006128114 A1 | 11/2006 |

OTHER PUBLICATIONS

International Preliminary Report on Patentability and Written Opinion in counterpart International Application No. PCT/EP2010/055985, mailed Nov. 24, 2011.
International Search Report dated Jul. 23, 2010 in corresponding PCT/EP2010/055985.
Alexander, "Clock Recovery from Random Binary Signals", Electronics Letters, IEE Stevenage, GB, vol. 11, No. 22, Oct. 30, 1975.

* cited by examiner

*Primary Examiner* — Hai L Nguyen

(57) ABSTRACT

Phase detection techniques in which an input signal is sampled to obtain several samples at different points in time with respect to a clock, said different points in time comprising an earliest point and latest point. The detection techniques further include generating a phase control signal obtained from the several samples of the input signal.

20 Claims, 13 Drawing Sheets

| 1 | 2 | 3 | 4 | 1 | 2 | 3 | 5 |
|---|---|---|---|---|---|---|---|
| PDR | | | | PDF | | | |
| $s_B(n-1)$ | $s_A(n)$ | $s_B(n)$ | output | $s_B(n-1)$ | $s_A(n)$ | $s_B(n)$ | output |
| 0 | 0 | 0 | 0 | 0 | 0 | 0 | 0 |
| 0 | 0 | 1 | -1 | 0 | 0 | 1 | 0 |
| 0 | 1 | 0 | 0 | 0 | 1 | 0 | 0 |
| 0 | 1 | 1 | 1 | 0 | 1 | 1 | 0 |
| 1 | 0 | 0 | 0 | 1 | 0 | 0 | 1 |
| 1 | 0 | 1 | 0 | 1 | 0 | 1 | 0 |
| 1 | 1 | 0 | 0 | 1 | 1 | 0 | -1 |
| 1 | 1 | 1 | 0 | 1 | 1 | 1 | 0 |

Fig. 1

| $s_B(n-1,\tau)$ | $s_A(n,\tau)$ | $s_B(n,\tau)$ | | | output | | |
|---|---|---|---|---|---|---|---|
| a | b | c | $a \oplus b$ | $b \oplus c$ | A | P | Q |
| 0 | 0 | 0 | 0 | 0 | 0 | 0 | 0 |
| 0 | 0 | 1 | 0 | 1 | -1 | 1 | 1 |
| 0 | 1 | 0 | 1 | 1 | 0 | 0 | 1 |
| 0 | 1 | 1 | 1 | 0 | 1 | 1 | 0 |
| 1 | 0 | 0 | 1 | 0 | 1 | 1 | 0 |
| 1 | 0 | 1 | 1 | 1 | 0 | 0 | 1 |
| 1 | 1 | 0 | 0 | 1 | -1 | 1 | 1 |
| 1 | 1 | 1 | 0 | 0 | 0 | 0 | 0 |

Fig. 2

| $s_A(n-1)$ | $s_B(n-1)$ | $s_A(n)$ | $s_B(n)$ | $s_A(n+1)$ | output |
|---|---|---|---|---|---|
| 0 | 0 | 0 | 1 | 1 | -1 |
| 0 | 0 | 1 | 1 | 1 | 1 |
| 1 | 1 | 0 | 0 | 0 | 1 |
| 1 | 1 | 1 | 0 | 0 | -1 |
| default | | | | | 0 |

Fig. 14

| PDSR | | | | | |
|---|---|---|---|---|---|
| $s_A(n-1)$ | $s_B(n-1)$ | $s_A(n)$ | $s_B(n)$ | $s_A(n+1)$ | output |
| 0 | 0 | 0 | 1 | 1 | -1 |
| 0 | 0 | 1 | 1 | 1 | 1 |
| 1 | 1 | 0 | 0 | 0 | 0 |
| 1 | 1 | 1 | 0 | 0 | 0 |
| default | | | | | 0 |

Fig. 15

| PDSF | | | | | |
|---|---|---|---|---|---|
| $s_A(n-1)$ | $s_B(n-1)$ | $s_A(n)$ | $s_B(n)$ | $s_A(n+1)$ | output |
| 0 | 0 | 0 | 1 | 1 | 0 |
| 0 | 0 | 1 | 1 | 1 | 0 |
| 1 | 1 | 0 | 0 | 0 | 1 |
| 1 | 1 | 1 | 0 | 0 | -1 |
| default | | | | | 0 |

PHASE DETECTION METHOD AND PHASE DETECTOR

The present invention relates to a phase detection method and a phase detector according to the preamble parts of claims 1 and 10, respectively. Such a method and phase detector are described in J. D. H. Alexander, "Clock Recovery from Random Binary Data", Elect. Lett., vol. 11, pp. 541-542, October 1975, later referred to as Alexander75.

This invention relates to timing or clock recovery utilizing pulse shape features. In particular the invention improves clock recovery for optical high-speed data transmission systems using optical duo-binary (ODB) or chirp managed laser (CML) modulation formats in the presence of significant residual dispersion.

Timing Recovery

Timing recovery is a critical receiver function in high-speed communication systems. The receiver clock must be continuously adjusted in its frequency and phase to optimize the sampling instants of the received data signal and to compensate for frequency drifts between the oscillators used in the transmitter and receiver clock circuits. Usually, a clock synchronizer should perform both functions. In some cases an additional phase adjustment is needed. Background Art for timing recovery is described e.g. in W. R. Bennett, "Statistics of regenerative digital transmission", Bell. Syst. Tech. J., vol. 37, pp. 1501-1542, November 1958; Y. Takasaki, "Timing extraction in baseband pulse transmission", IEEE Trans. Commun., vol. COM-20, pp. 877-884, October 1972; and L. E. Franks and J. P. Bubrouski, "Statistical properties of timing jitter in a PAM timing recovery system", IEEE Trans. Commun., vol. COM-22, pp. 913-920, July. 1974.

In some older systems, a specific carrier corresponding to the sampling frequency was transmitted, providing frequency and phase information for sampling. However, most modern systems do not provide a carrier; it is therefore important to accurately recover the symbol timing using only the received signal which is referred to as self-timing.

A crude distinction can be made between two classes of clock recovery methods applied to pulse amplitude modulation (PAM) signals:
1. spectral line generating synchronizers and
2. synchronizers utilizing pulse shape features.

The second class of methods, to which this invention belongs, exploits some feature of the pulse shape characteristics (cf. B. R. Saltzberg, "Timing recovery for synchronous binary data transmission", Bell. Syst. Tech. J., vol. 46, pp. 593-622, March 1967). The most frequently used synchronizers of this class locate the threshold crossings of the received base-band signal. The mean location of the crossings is estimated and the optimum sampling instant and maximum eye opening are assumed to be halfway between these crossings (cf. Alexander75 and C. R. Hogge, "A Self-Correcting Clock Recovery Circuit", IEEE J. Lightwave Tech., vol. 3, pp. 1312-1314, December 1985). Similar disclosures are comprised in US 2003/0219090 A1 and WO 2006/128114 A1. A synchronizer described in K. H. Mueller and M. Müller, "Timing recovery in digital synchronous data receivers", IEEE Trans. Commun., vol. COM-24, pp. 516-531, May. 1976 uses the receiver decisions for the timing function. This method requires the derivation of a timing error estimate that gives timing information at the arrival of each data symbol. This yields relatively high variance estimates of the timing error that is avoided in the method explained in A. Jennings and B. R. Clarke, "Data-Sequence Selective Timing Recovery for PAM Systems", IEEE Trans. Commun., vol. COM-33, pp. 729-731, July. 1985. Some interesting ideas can be found in M. Arai, M. Yamaguchi and T. Ogata, "DIGITAL SIGNAL RECEIVING CIRCUIT WITH MEANS FOR CONTROLLING A BAUD RATE SAMPLING PHASE BY A POWER OF SAMPLED SIGNALS", U.S. Pat. No. 5,048,060, Sep. 10, 1991; J. Ragnar, O. Sverrir and B. Elias, "TIMING RECOVERY FOR A HIGH SPEED DIGITAL DATA COMMUNICATION SYSTEM BASED ON ADAPTIVE EQUALIZER IMPULSE RESPONSE CHARACTERISTICS"; PCT, No. WO 00/19655, Apr. 6, 2000; and B. Joseph, H. Syang-Myau and R. Roopa, "SYMBOL TIMING RECOVERY METHOD FOR LOW RESOLUTION MULTIPLE AMPLITUDE SIGNALS", PCT, No. WO 02/30035 Apr. 11, 2002, that use either an autocorrelation function, equalizer outputs or over-sampled signals for timing extraction, respectively.

PCT/US03/05515 teaches that two versions of the clock being shifted by 90° (VCO_I, VCO_Q) are sampled upon rising or falling edges in the data signal.

The best timing phase for a given system depends on the overall impulse response and thus on the characteristics of the communication channel. The main problems are caused by noise, distortion and unknown delay. These disturbances can severely limit the performance of synchronizer.

Our objective was to design a robust clock synchronizer that will be able to cope with the serious distortions present in optical transmission systems. Besides noise, most of the problems affecting the performance of timing recovery circuits are caused by distortions such as chromatic dispersion, polarization mode dispersion, self-phase modulation and cross-phase modulation. None of the well-known synchronizers used in current practical systems is able to cover such a wide spectrum of distortion as the synchronizers described in this innovation report. We will limit the explanation of the method to the application to binary optical transmissions. However, this fact does not limit the application of the synchronizer in any binary and multilevel PAM transmission system.

Digital Receiver

FIG. 7 shows an optical receiver 30 which is essentially known from EP 1 494 413 A1 and receives an analog input signal r(t) from an optical channel 29. The receiver 30 comprises a physical interface (PI) 31, an automatic gain controller (AGC) or variable gain amplifier (VGA) 32, an analog-to-digital converter (ADC) 33, a clock recovery (CR) subsystem 34, a sampling phase adjustment (SPA) circuit 35, a maximum likelihood sequence estimator (MLSE) 38, a forward error correction (FEC) decoder 39, a channel model unit 37 and a receiver control node 36.

The physical interface 31 performs an optical-to-electrical (O/E) conversion. The physical interface 31 uses either a pin diode or an avalanche photo diode to convert the incident optical power to an electrical current. A transimpedance amplifier (TIA) is used to amplify and convert the photocurrent to a voltage.

The analog serial signal data at the output of physical interface 31 is amplified by a high-gain high-dynamic, low-noise AGC or VGA circuit 32. The output signal of AGC 32 is designated $\tilde{r}(t)$.

The ADC 33 digitizes the analog signal $\tilde{r}(t)$ and outputs quantized data $y_{t,s}$. Index t refers to a time slot and index s refers to different sampling phases. Index s may assume the values 1 to S for S-fold oversampling. S may be 2. The ADC 33 receives a sampling clock from SPA circuit 35 which in turn receives a sampling clock from clock recovery subsystem 34. The SPA circuit 35 operates as an adjustable delay in order to optimize the phase of the clock e.g. in terms of overall bit-error rate (BER), which is to say to optimize the sampling times of ADC 33. The SPA circuit 35 may or may not be present.

The quantized data $y_{t,s}$ are input into MLSE 38. MLSE 38 may implement a Viterbi algorithm (VA) and outputs the most likely sequence designated detected data $u_t$ to FEC decoder 39. In a typical optical receiver, with a powerful FEC code used, the bit error rate at the output of MLSE 38 ranges e.g. from $10^{-2}$ to about $10^4$. The subsequent FEC decoder 39 further reduces bit error rate to a range between $10^{-9}$ and $10^{-16}$ which is required for data transmission. FEC decoder 39 outputs decoded data $x_t$ for further processing. MLSE 38 and/or FEC 39 may obtain BER estimates and provide same to control node 36.

Control node 36 receives a loss-of-signal (LOS) signal from physical interface 31 and may receive counter values or event frequency information $b_t$ from channel model unit 37 in order to obtain pre-processed statistics data for controlling the AGC/VGA circuit 32, CR 34 and SPA circuit 35.

The clock recovery (CR) circuit 34 extracts frequency and phase information from the received signal and generates a local sampling clock at equidistant points in time, with some fixed phase relation to the transmitted symbol stream. Instead of using the analog signals after the AGC, the clock recovery circuit 34 can also use the quantized samples $y_{t,2}$ directly from the ADC 33.

Early-Late Phase Detector

After an optical-to-electrical conversion, a typical non-return-to-zero (NRZ) electrical signal s(t) that corresponds to a binary unit conveyed over an undistorted optical channel may have a shape as presented in FIG. 3. The finite bandwidth of the receiver filter has introduced inter-symbol interference that is visible in this FIG. 3.

Two samples corresponding to the current symbol (n-th sent symbol) are denoted as $s_A(n,\tau)$ and $s_B(n,\tau)$. The sample $s_A(n,\tau)$ is obtained at time instant $(n-1)T+\tau$ and the sample $s_B(n,\tau)$ is located at time instant $(n-1)T+T/2+\tau$. The symbol period is denoted by T.

A variant of an early-late detector, the Alexander phase detector 10 described e.g. in Alexander75, uses three samples 1, 2 and 3 to derive phase information. The algorithm is described in FIG. 2. Alexander75 discloses a circuit diagram similar to FIG. 4 for implementing this algorithm.

The input signal 51 passes limiter 11 which receives an offset from a voltage source 12. Samples are taken and stored by clocked D-type monostables 13, 14, 15 and 16 such that three successive samples 1, 2 and 3 designated variables a, b and c by Alexander75 can be examined simultaneously. Clocks C, CM and CC are at the nominal data rate. CM is arranged to be near to the mid-bit instant whilst CC occurs at the changeover time. Complimentary squarewave clock waveforms of CM and CC and edge triggered monostables ensure exactly interleaved sampling.

The logic control signals P and Q may control an oscillator which may be designed to operate either of three frequencies: $f_0$ if P=0, $f_o+f_x$ if P=1 and Q=0, and $f_o-f_x$ if P=1 and Q=1. Alternatively, a 3-valued variable A may be generated by XOR-gates 19 and 20, and subtractor 21. A is 0, when the signal transition is not detected or when the transitions are not "clear" (010 or 101 sample combinations). However, A is −1 with a late transition (001 or 110), and A is 1 with an early transition (011 or 100).

Phase Detector Characteristics

According to H. Meyr, M. Moeneclaey, and S. A. Fechtel, "Digital Communication Receivers", John Wiley & Sons, Inc., chap. 2.3, pp. 89-111, 1998, phase detectors can be analyzed in a unified way by studying:
  Timing error detector characteristic (TEDC),
  TEDC slope in the zero of TEDC, or related: the maximum TEDC amplitude TEDCMAX), and
  Linearized timing error deviation (LTED)

The TEDC models the useful error feedback signal in a phase locked loop (PLL). The zeroes of this function with positive slope are equilibrium points. The TEDC is defined as the averaged phase detector output as a function of the phase difference between the received signal and reference signal, assuming a constant phase difference. Note that this is not the same as the instantaneous output of the phase detector at a given phase difference; the latter can be understood as a noisy version of the TEDC value. The graph of TEDC can be obtained experimentally by displaying the phase detector output under a small frequency difference.

There are channels e.g. optical signal-to-noise ratio (OSNR)=14 dB, a residual dispersion (RD) of 2200 ps/nm and non return to zero (NRZ) waveform for which the phase detector TEDC is very weak. For this channel, the CR is not able to generate a stable clock, due to the lack of a strong enough phase error feedback.

The TEDCMAX is a figure of merit for the comparison of phase detectors with similar TEDC shape. It is related to the TEDC slope used in the analytical study of phase detector performance. Reduced TEDCMAX values (and with it reduced TEDC slopes) lead to the decrease of phase detector performance over a wide range of distortions. NRZ TEDC-MAXs of Alexander phase detector between RD of 2000 and 3000 ps/nm does not seem to be large enough for the clock extraction. In this region simulations show that the Alexander phase detector fails, and that is observed experimentally as well.

The linearized timing error deviation (LTED) indicates the amount of jitter expected at a certain sampling point. NRZ LTED's for the Alexander phase detector at the equilibrium point also indicate that clock recovery problems arise in the range of RD between 2000 and 3000 ps/nm. Such increased phase jitter of the Alexander phase detector is easily observed experimentally.

The same problems exist with other modulation formats (e.g. return-to-zero (RZ), ODB and CML). The critical RD range just depends on the modulation format and the channel characteristics. The presence of polarization mode dispersion (PMD) additionally impacts on the CR performance.

It is the object of this invention to provide an enhanced phase detection method and phase detector.

This object is achieved by the subject matter of the independent claims.

Preferred embodiments of the invention are the subject matter(s) of the dependent claims.

In the following preferred embodiments of this invention are described referring to the accompanying drawings.

FIG. 1 shows a table illustrating a rising and falling phase detector rule.

FIG. 2 shows a table illustrating the Alexander phase detector rule.

FIG. 14 shows an advanced phase detector rule for strong transitions.

FIG. 15 shows an advanced phase detector rule for strong rising transitions.

FIG. 16 shows an advanced phase detector rule for strong falling transitions.

ABBREVIATIONS

Figure 3:
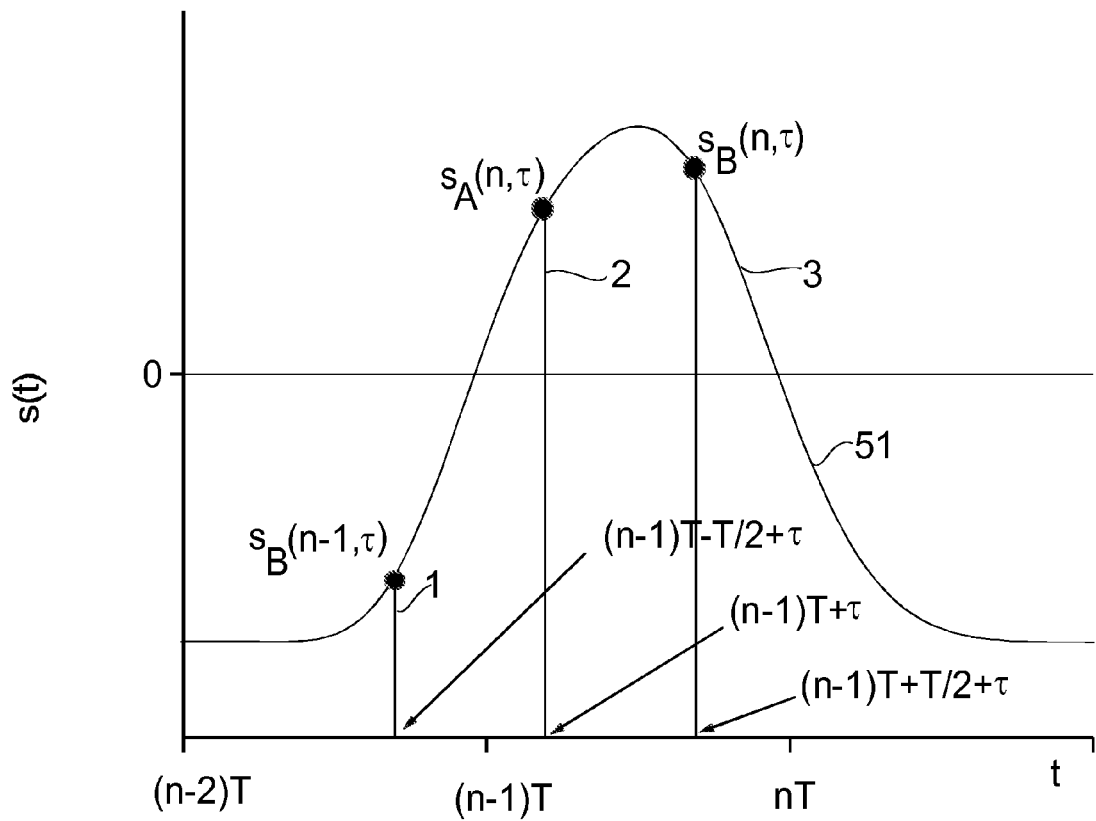
FIG. 3 shows an example of a received pulse.

| | |
|---|---|
| ADC | Analog-to-digital converter |
| AGC | Automatic gain controller |
| AlexPD | Alexander phase detector |
| BER | Bit error rate |
| CB | Control block |
| CHD | Chromatic dispersion |
| CML | Chirp managed laser |
| CR | Clock recovery |
| DC | Direct currrent |
| DEQ | Digital equalizer |
| DGD | Differential group delay |
| DPC | Differential phase control |
| DPCS | Differential phase control signal |
| DSV | Distance sample vector |
| ECC | Error correcting code |
| FEC | forward error correction |
| ISI | Intersymbol interference |
| I-PDF | in-phase PDF |
| I-PDR | in-phase PDR |
| LTED | Linearized timing error deviation |
| LOL | loss-of-lock |
| LOS | loss-of-signal |
| LPF | Low-pass filter |
| MLSE | maximum likelihood sequence estimator |
| NRZ | Non return to zero |
| ODB | Optical duo-binary |
| OSNR | Optical signal-to-noise ratio |
| PAM | Pulse amplitude modulation |
| PD | Phase detector |
| PDF | Falling PD |

-continued

| | |
|---|---|
| PDGF | Phase detector generator function |
| PDR | Rising PD |
| PDSF | PD for strong rising transitions |
| PDSR | PD for strong falling transitions |
| PI | Physical interface |
| PLL | Phase-locked loop |
| PMD | Polarization mode dispersion |
| Q-PDF | quadrature PDF |
| Q-PDR | quadrature PDR |
| RD | Residual dispersion |
| RZ | Return-to-zero |
| TEDC | Timing error detector characteristic |
| TEDCMAX | TEDC maximum |
| SPA | Sampling phase adjustment |
| SPD | Symmetrical PD |
| SPDF | Symmetrical PDF |
| SPDR | Symmetrical PDR |
| TIA | Transimpedance amplifier |
| VCO | Voltage controlled oscillator |
| VGA | Variable gain amplifier |
| UI | Unit interval |

While the present invention is described with reference to the embodiments as illustrated in the following detailed description as well as in the drawings, it should be understood that the following detailed description as well as the drawings are not intended to limit the present invention to the particular illustrative embodiments disclosed, but rather the described illustrative embodiments merely exemplify the various aspects of the present invention, the scope of which is defined by the appended claims.

Differential Phase Control

The Alexander phase detector uses three samples (hard decisions) for detecting transitions. It evaluates both rising and falling transitions. When a transition is detected, the Alexander phase detector generates "early/late" timing error information (+1 or −1) that is used for phase (or frequency) adjustment. The best performance, in jitter and lock-in behavior, is achieved in a PLL when the rising and falling transitions are at the same position in a unit interval T. The worst performance is obtained when the difference between these two positions is equal to T/2. One solution is to discard one of the transitions and work either with a falling or with a rising transition. However, in this case the timing information of one type of transition is lost.

Let us consider two TEDCs, namely $TEDC_R$ and $TEDC_F$ that correspond to two separate phase detectors that evaluate the rising and falling transitions, respectively. FIG. 1 lists outputs 4 and 5, respectively, of the corresponding phase detectors PDR and PDF, respectively.

Figure 4:
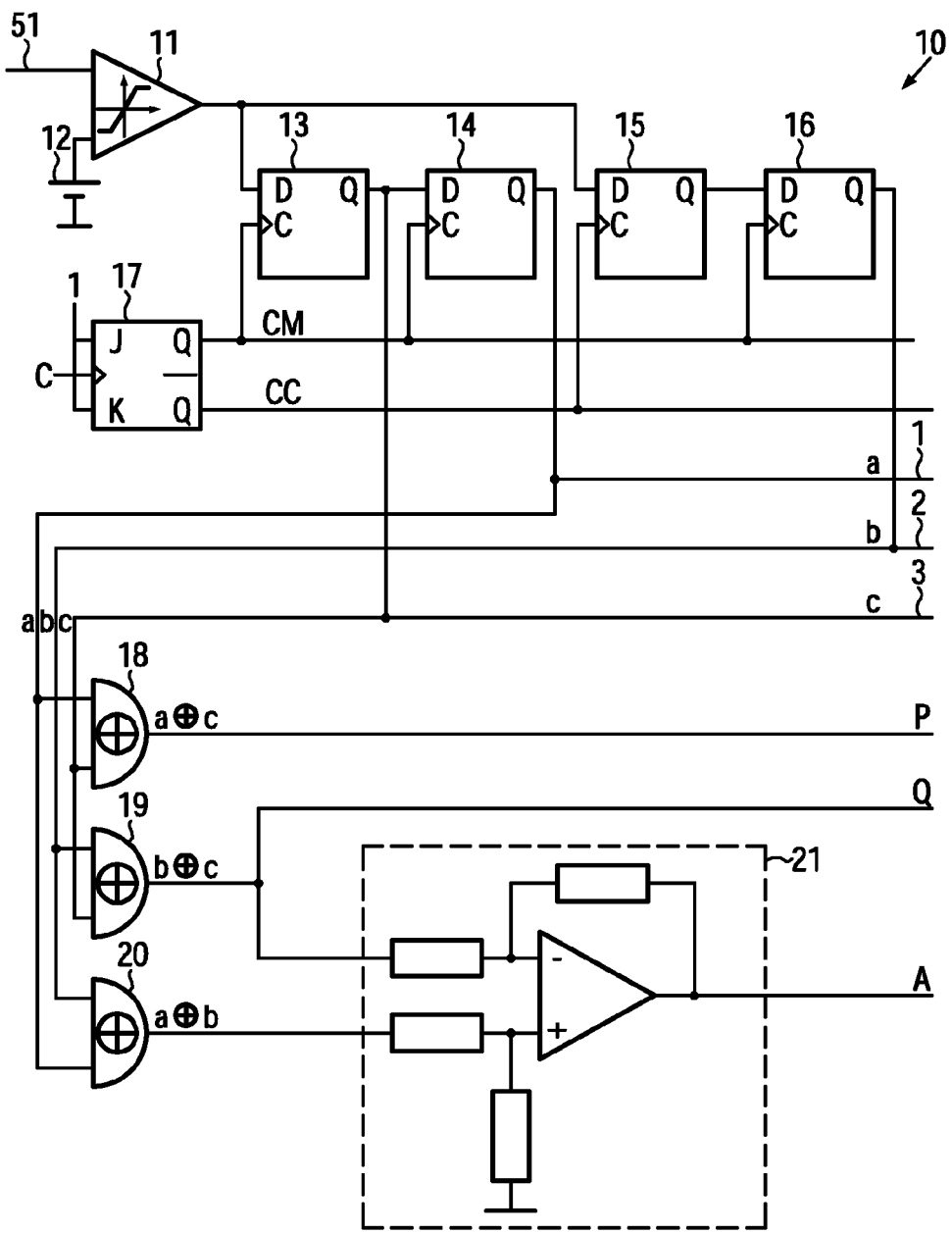
FIG. 4 shows a circuit diagram of the Alexander phase detector.
Figure 5:
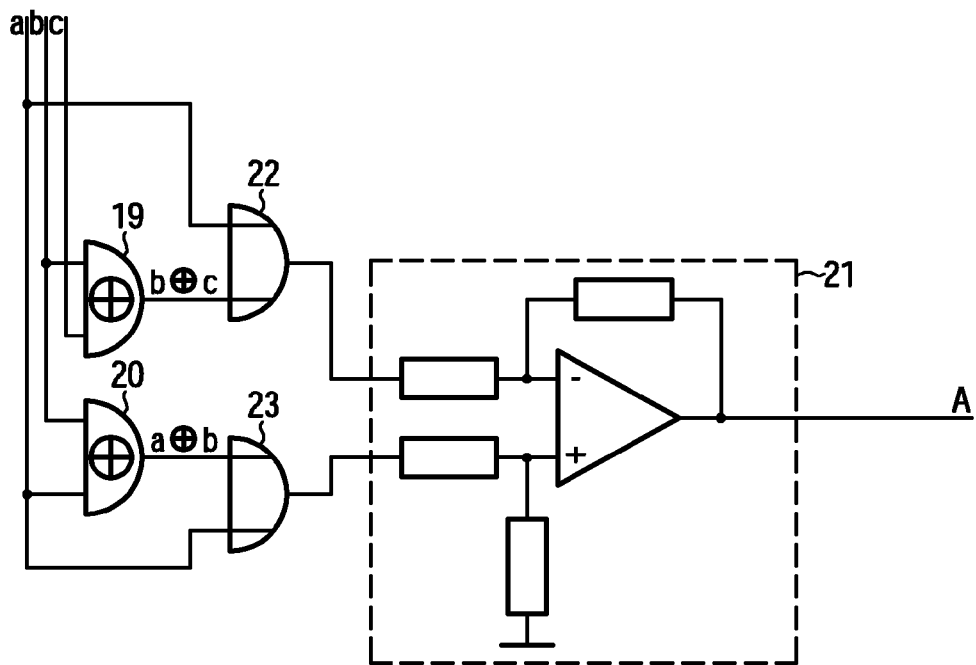
FIG. 5 shows an implementation of a rising phase detector.
Figure 6:
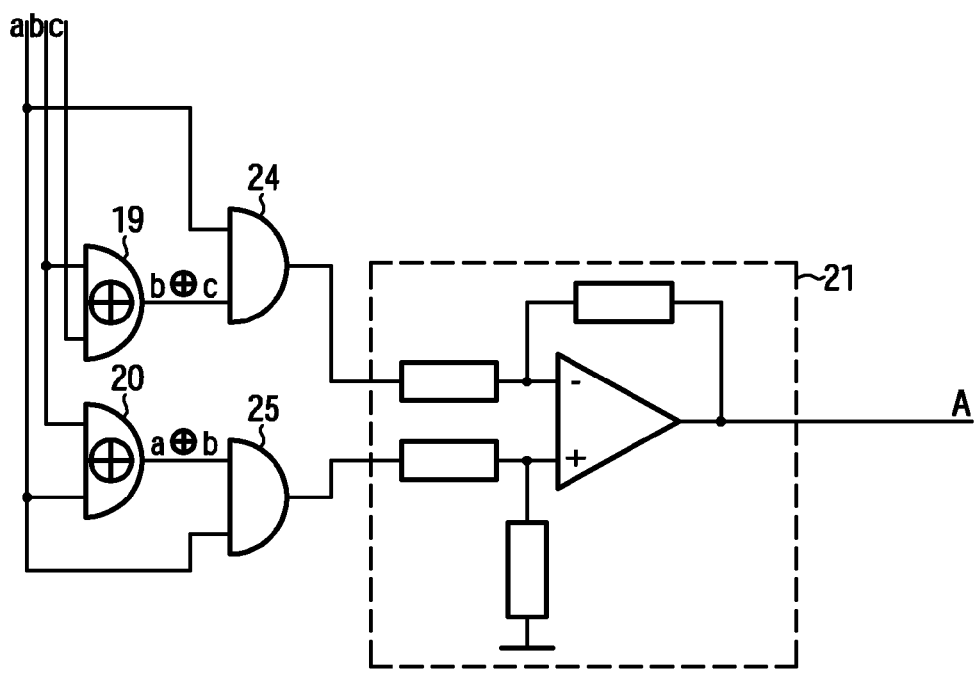
FIG. 6 shows an implementation of a falling phase detector.

It is obvious to skilled persons that a PDR may be implemented for example by supplementing the Alexander logic shown in FIG. 4 by two OR-gates 22 and 23 as shown in FIG. 5. In a similar way, a PDF may be implemented for example by supplementing the Alexander logic by two AND-gates 24 and 25 as shown in FIG. 6.

Figure 8:
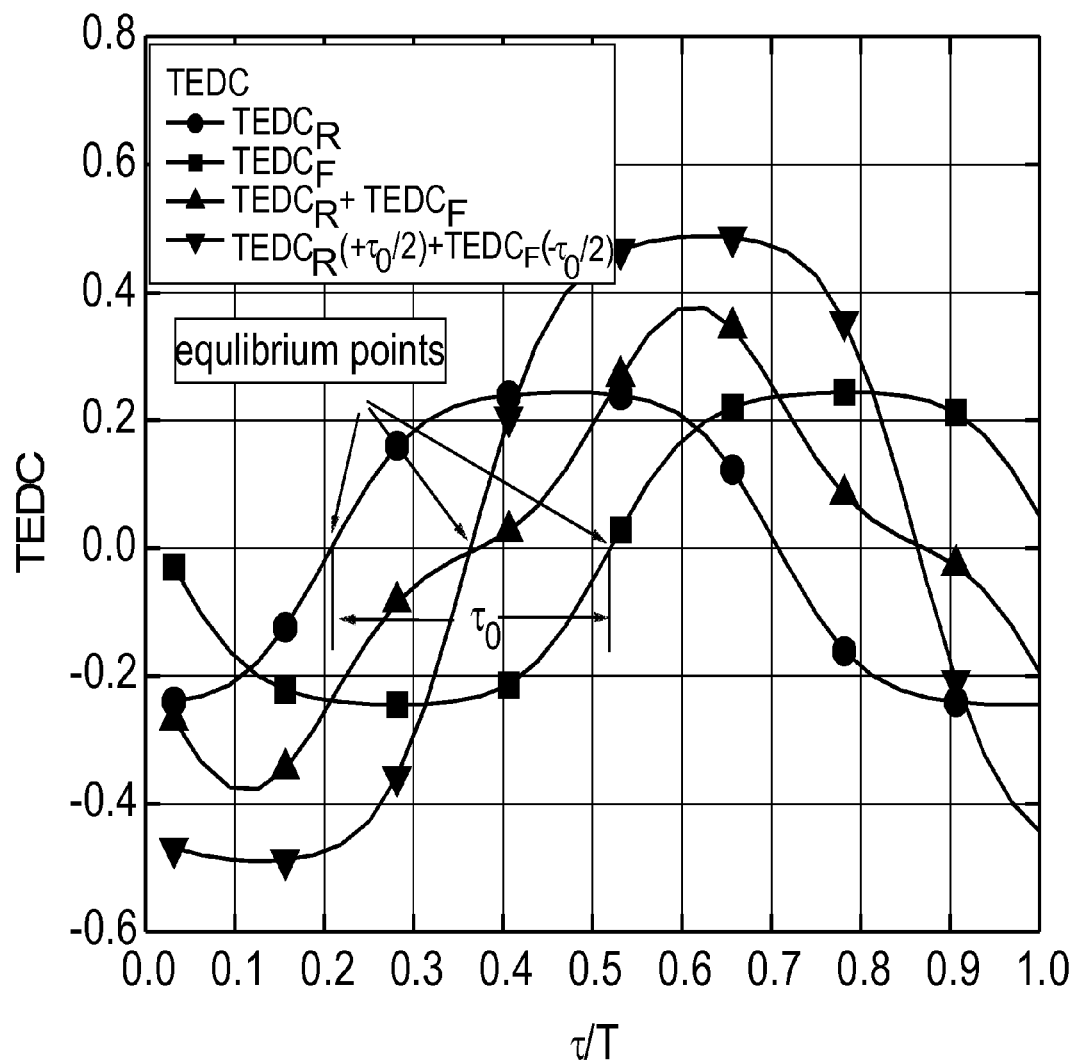
FIG. 8 shows examples of timing error detector characteristics of an Alexander phase detector for an NRZ waveform.

When the TEDC zero crossings, which are TEDC equilibrium points, are not at the same location in a unit interval, the overall TEDC ($TEDC_R+TEDC_F$) can be weak as is shown in FIG. 8. The two-phase detector ($TEDC_R+TEDC_F$) concept then produces a high jitter because the slope of the equivalent TEDC is low at the equilibrium point (phase). The equilibrium points for the rising and falling TEDCs are separated by the time distance of $\tau_0$ in FIG. 8. When this distance is equal to half of a unit interval the CR surely fails because the TEDC is a constant zero.

However, by applying a suitable differential delay, i.e. by advancing the local clock signal for PDR and delaying the local clock signal for PDF by the same amount of $\tau_0/2$, we can effectively shift the two TEDCs being added so that they have the same equilibrium positions. The equivalent TEDC (TEDC$_R$($\tau+\tau_0/2$)+TEDC$_F$($\tau-\tau_0/2$)) is also shown in FIG. 8. This TEDC has a larger maximum value than the maxima of all three TEDCs mentioned before. The new TEDC also exhibits a large slope at the equilibrium point, which is an additional and most important advantage of the TEDC shifting approach.

Figure 9:
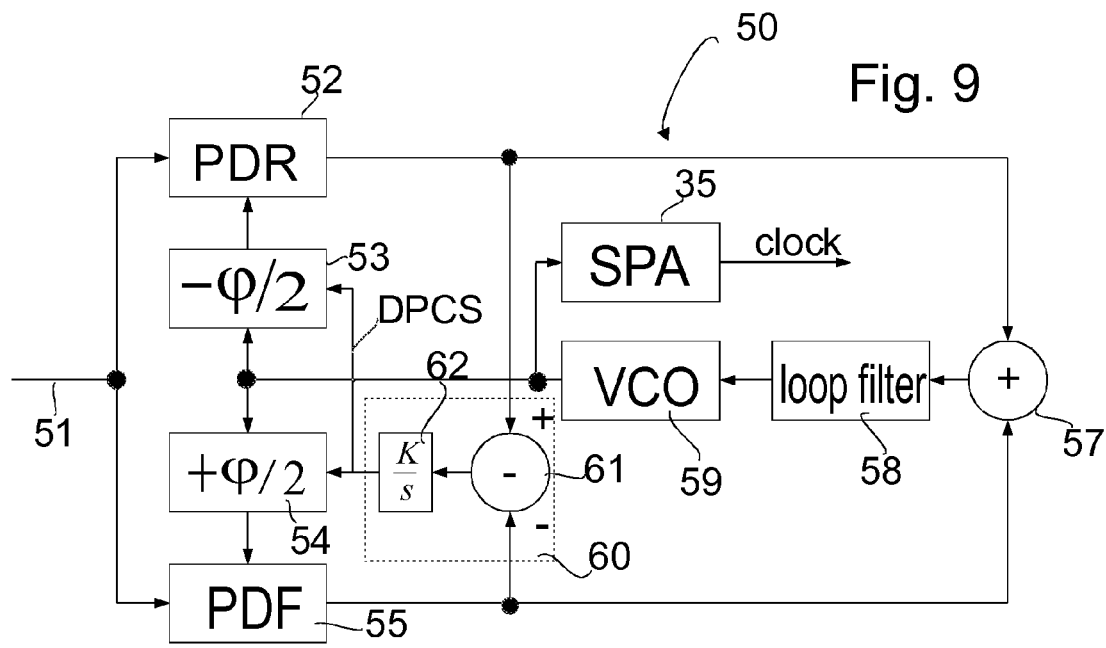
FIG. 9 shows a block diagram of a 2-PD differential clock-recovery circuit.

As shown by example, differentially adjusting the phases of the signals seen by rising and falling phase detectors in order to achieve identical equilibrium phases improves the performance. A block diagram of a clock recovery circuit using this differential phase control concept is presented in FIG. 9. The block diagram in FIG. 9 shows a differential clock-recovery circuit 50 comprising a phase detector completed by a loop filter 58 and a voltage controlled oscillator (VCO) 59 to a phase-locked loop (PLL). In addition an SPA circuit 35 is shown. The phase detector comprises a rising phase detector (PDR) 52, two adjustable phase shifters 53 and 54, a falling phase detector (PDF) 55, a differential phase control block 60 and an adder 57. The two adjustable phase shifters 53 and 54 receive the clock with phase θ from VCO 59. Adjustable phase shifter 53 advances in the clock phase by φ/2 equivalent to the time difference $\tau_0/2$ and provides an advanced clock to PDR 52.

Adjustable phase shifter 54 delays the clock phase by φ/2 and provides a delayed clock to PDF 55. Adder 57 adds the phase control signals outputted by PDR 52 and PDF 55 for providing a single phase control signal to filter 58. The differential phase control (DPC) block 60 comprises a subtractor 61 and an ideal integrator 62 which has a gain of K at unity frequency. The integrator 62 controls the speed of the differential phase adjustment for subtracting the phase control signal of PDF 55 from the phase control signal of PDR 52 and integrating this difference.

The DPC 60 estimates the difference between two equilibrium points and outputs a signal that is used as an error signal for the adjustment of the differential phase φ until the shifted TEDCs match. The VCO steady-state phase $\phi_{VCO}$ is between two equilibrium points. The PDR sampling clock has a phase of $\phi_{VCO}-\phi/2$, while the PDF samples at phase $\phi_{VCO}+\phi/2$.

We propose two DPC realizations

Two-phase detector DPC (2-PD DPC) (FIGS. 9 and 19) and

Figure 10:
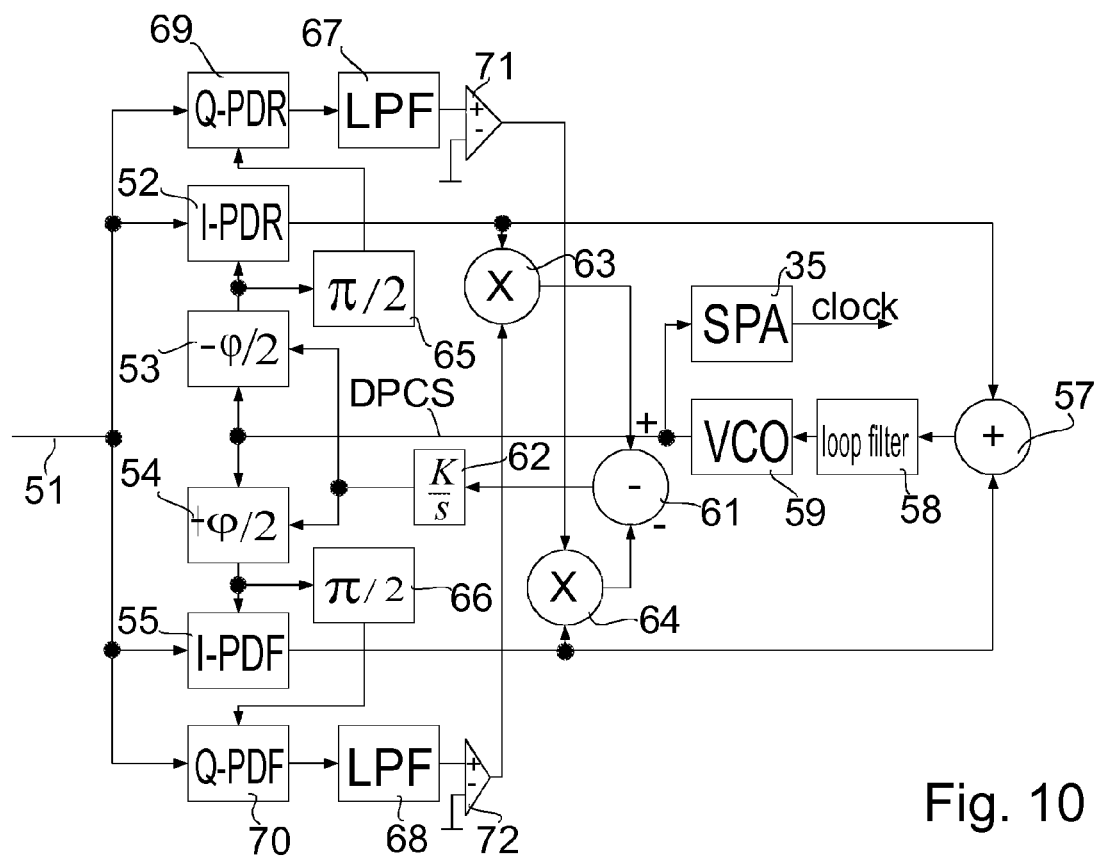
FIG. 10 shows a block diagram of a 4-PD differential clock-recovery circuit.

Four-phase detector DPC (4-PD DPC) (FIG. 10).

The first approach uses two phase detectors 52 and 55 and estimates the difference between the equilibrium points in their outputs. The algorithm has low complexity and provides almost the same results as the second DPC method. The advantage of the second method is that the 4-PD DPC always keeps the VCO clock on a well-defined side of the rising PD equilibrium point (i.e. the sign of the difference between VCO clock and the closest PD equilibrium is well-defined). For reasons not explained in detail, this helps to avoid a 0.5 UI sampling phase ambiguity, which is important in equalizing receivers using some a priori knowledge about a sampling phase dependent channel model for detection, such as a blind MLSE receiver.

As a model for understanding, let us suppose that the TEDCs are sinusoidal functions, which is very close to reality in the presence of noise, i.e. as $$TEDC_R(\theta)=\sin(\theta+\phi/2)$$

$$TEDC_F(\theta)=\sin(\theta-\phi/2). \quad (1)$$

TEDC$_R$(θ) is the averaged output of rising phase detector 52 at sampling phase θ. Likewise, TEDC$_F$(θ) is the averaged output of falling phase detector 55.

Then the differential phase control signal (DPCS) is equal to $$DPCS(\theta,\phi)=TEDC_R(\theta)-TEDC_F(\theta)=2\cos(\theta)\sin(\phi/2) \quad (2)$$

Figure 12:
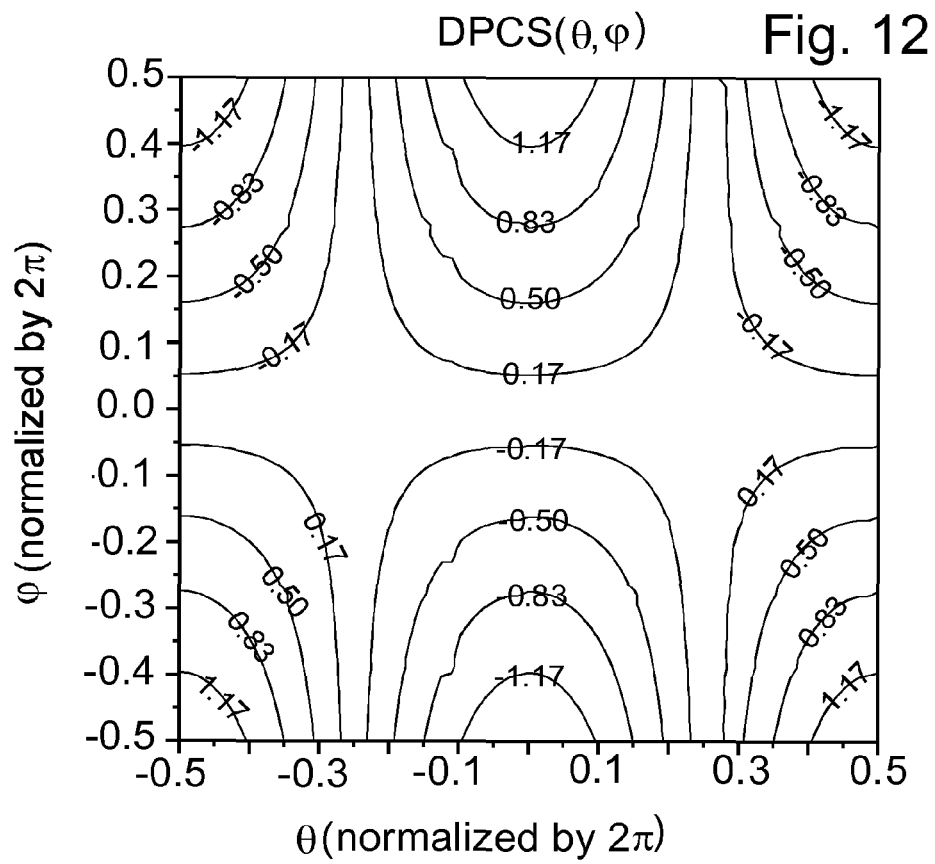
FIG. 12 shows the control signal dependency on differential phase φ and current sampling phase θ for a 2-PD differential clock-recovery circuit.

The DPCS is shown in FIG. 12. It can be seen that the control signal depends on both the differential phase φ and the current sampling phase θ. For reasons not explained in detail this causes a 0.5 UI sampling phase ambiguity (depending on the sign of cos(σ)): There are two sampling phases at which the PLL can deliver a clock, e.g. in the middle of the eye or at its edge, but only one of the two is favorable. However, the 2-PD DPC does not assure that the VCO phase is the desired one.

To avoid this sampling phase ambiguity, we propose the 4-PD DPC that is shown in FIG. 10. Compared to FIG. 9, FIG. 10 shows a quadrature PDR (Q-PDR) 69, quadrature PDF (Q-PDF) 70, two π/2 phase-shifters 65 and 66, two low-pass filters (LPF) 67 and 68, two multipliers 63 and 64 and two comparators 71 and 72 in addition. The LPFs 67 and 68 average outputs of the Q-PDR and Q-PDF, respectively, in order to obtain TEDCs. This reduces phase noise in the PLL and hence sampling phase jitter. Each of the low pass filters 67, 68 is followed by a comparators 71 and 72, respectively, such that the value passed on to the multipliers 64 and 63, respectively, is either "+1" or "−1". Comparators would not be necessary with ideal, offset-free multipliers, but are quite helpful to cope with realistic multiplier circuits.

In addition, LPFs may be provided at the outputs of the I-PDR and I-PDF for reducing noise resulting in sampling phase jitter.

The PDR 52 and PDF 55 are also present in FIG. 9, but are designated as in-phase PDR (I-PDR) and in-phase PDF (I-PDF) in FIG. 10 for clear distinction from Q-PDR 69 and Q-PDF 70 in FIG. 10.

Then, the TEDCs, namely TEDC$_R^I$(θ) TEDC$_R^Q$(θ) TEDC$_F^I$(θ) TEDC$_F^Q$(θ) of the phase detectors I-PDR 52, Q-PDR 69, I-PDF 55 and Q-PDF 70, respectively, are:

$$TEDC_R^I(\theta)=\sin(\theta+\phi/2)$$

$$TEDC_R^Q(\theta)=\sin(\theta+\phi/2+\pi/2)$$

$$TEDC_F^I(\theta)=\sin(\theta-\phi/2)$$

$$TEDC_F^Q(\theta)=\sin(\theta-\phi/2+\pi/2). \quad (3)$$

The differential phase control signal DPCS is equal to (cf. FIG. 10)

$$DPCS(\theta,\phi)=TEDC_R^I(\theta)TEDC_F^Q(\theta)-TEDC_R^Q(\theta)TEDC_F^I(\theta)=\sin(\phi). \quad (4)$$

Figure 13:
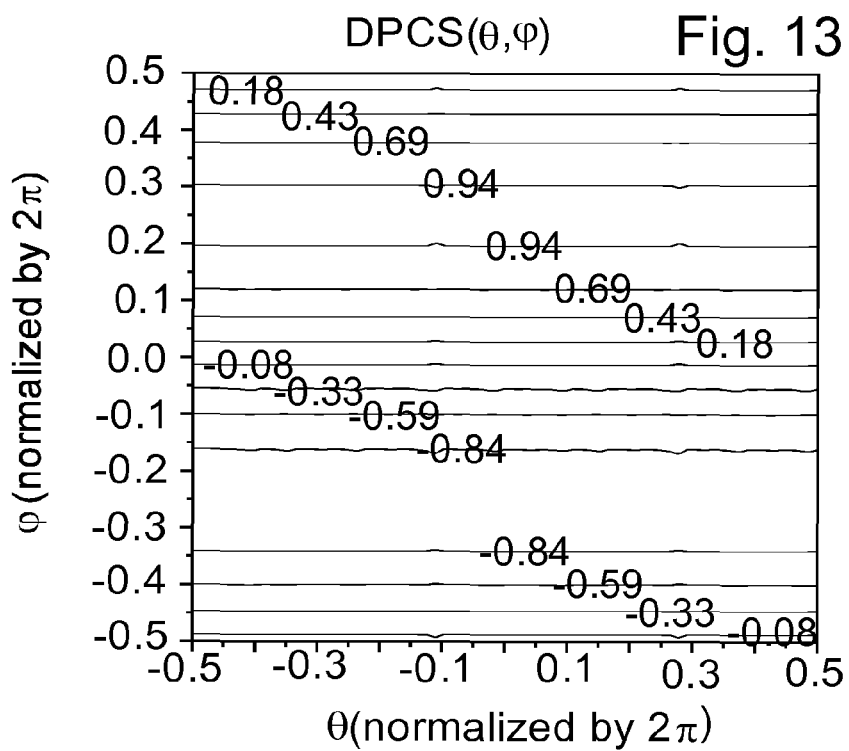
FIG. 13 shows the control signal dependency on differential phase φ and current sampling phase θ for a 4-PD differential clock-recovery circuit.

It can be noticed that the differential phase control signal DPCS does no longer depend on the sampling phase θ, see FIG. 13. This signal depends essentially on the phase difference φ only. By comparing FIGS. 9 and 10 it is apparent that the complexity of the four-phase detector is significantly higher. The complexity is increased by two PDs, two multipliers, and two low-pass filters (LPF). On the other hand, the existence of only one steady-state phase brings us additional advantages with blind equalizers using one sampling-phase dependent starting channel model.

Another advantage of the 4-PD eliminating the sampling phase dependent term cos(θ) is that it aids in the initial lock-in of the DPC control loop, when the PLL is still unlocked, which can be experimentally observed. In the presence of a frequency difference (i.e. when sampling phase is approximately linear in time) the expected DPCS of the 2-PD is zero, because the time average over the cos(θ) term is zero. Note that the DPC (for φ) must lock prior to and independent of the lock-in of the PLL (for θ).

In one preferred embodiment, the 4-PD is used for lock-in, and is switched to 2-PD operation after the PLL has locked, in order to avoid the noisy multiplication in nodes 63 and 64. This can be achieved by switching the Q inputs to constant sources.

Figure 11:
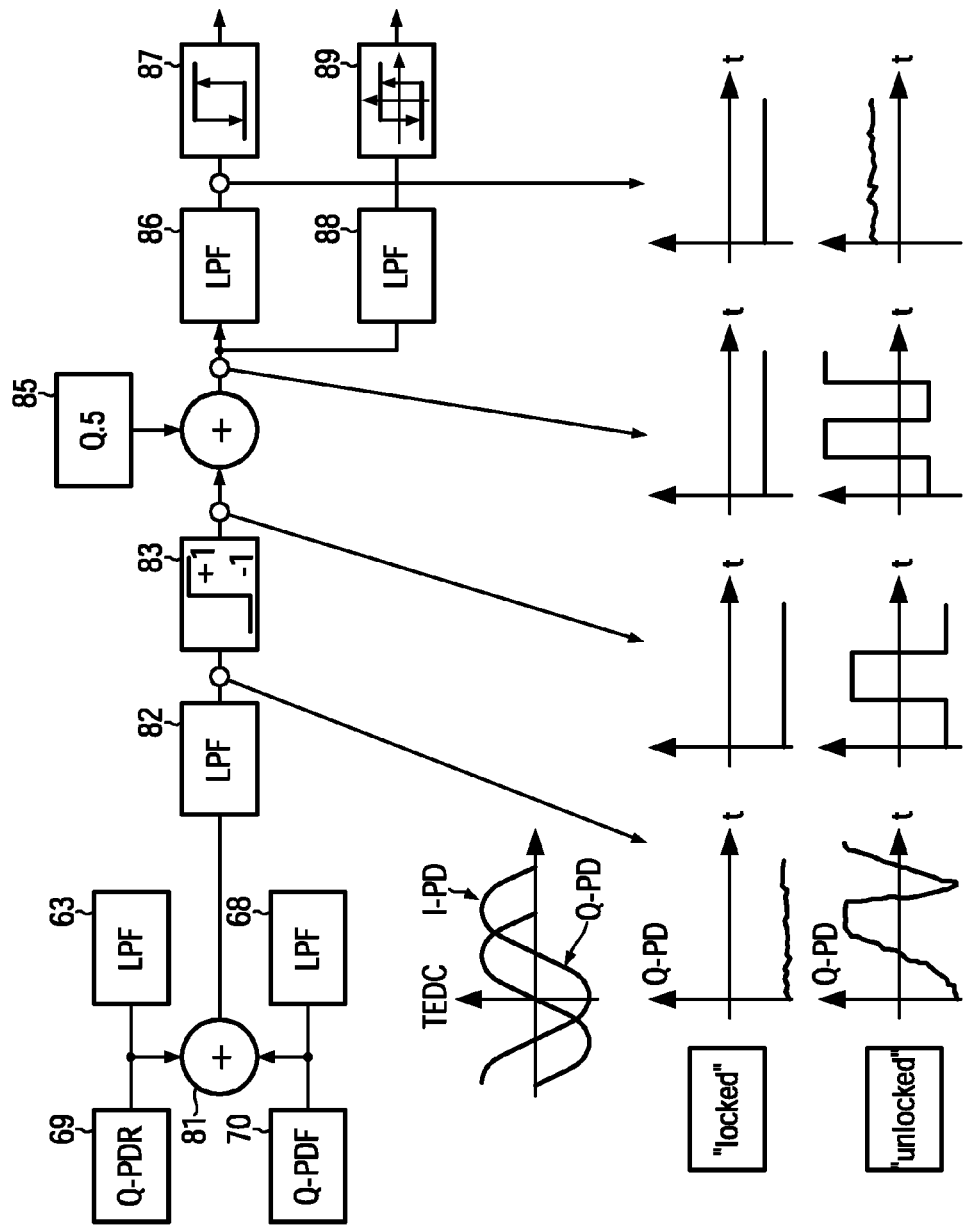
FIG. 11 shows a LOL circuit, which may supplement a 4-PD differential clock-recovery circuit.

Still another advantage of the 4-PD setup is that a low-pass filtered sum of the quadrature PD output signals can be used as a loss-of-lock detector for the PLL. To this end a LOL circuit as shown in FIG. 11 may be provided in addition to a 4-PD differential clock-recovery circuit. The lower part of FIG. 11 shows two rows of signal diagrams for different nodes of the LOL circuit. The upper row shows signals for a locked state, the lower row shows signals for the unlocked state, in which LOL is declared.

When the PLL shown in FIG. 10 is locked, the sum (I-PD signal) of the outputs of the in-phase phase detectors 52 and 53 is in its equilibrium and provides a "0" output on average. When the I-PD signal is in its equilibrium, by construction the sum of the outputs of the quadrature phase detectors 69 and 70 (Q-PD signal) provides the value "−1" on average (cf. the sinusoidal model of eq. (3)).

When the PLL is unlocked, the phase error changes over time at a speed given by the frequency difference between VCO frequency and the frequency of the incoming data. The averaged output both of Q-PD and of I-PD is "0" in this case, because both PD signals show a noisy version of their sinusoidal TEDC as a function of time.

The lock detector idea is then to make a threshold decision for averaged Q-PD output:

When the averaged Q-PD is above "−0.5" loss of lock (LOL raised) is declared

When the averaged Q-PD is below "−0.5", lock is declared (LOL cleared).

To this end an adder 81 is provided which adds the outputs of quadrature phase detectors 69 and 70 and outputs the Q-PD signal. A low-pass filter 82 has a cut-off frequency of 1 MHz, which may be switched to 10 MHz. Consequently, the low-pass filter 82 removes the clock frequencies of the VCO 59 signal and the incoming data signal, harmonics and sum frequencies. A sign circuit 83 amplifies and limits the output of the low-pass filter 82. The sign circuit 83 may be implemented by an amplifier with about 50 dB amplification. The output range of the amplifier may be chosen between a logical −1 and 1. In case of a lock, the sign circuit 83 outputs −1. In case of loss-of-lock, the sign circuit outputs a square wave switching between 1 and −1. The frequency of the square wave is equivalent to the difference between the VCO frequency and the bit rate of the incoming data signal.

Then the adder 84 and the offset generator 85 shift the output signal of the sign circuit 83 by 0.5. Consequently the output of offset generator 85 is either 1.5 or −0.5. The output of the adder 84 is again low-pass filtered by low-pass filters 86 and 88 and digitized by Schmitt-Triggers 87 and 89 with hysteresis, respectively, in order to avoid toggling. The low-pass filter 86 has a cut-off frequency of 0.1 MHz, which may be customized. The low-pass filter 88 has a cut-off frequency of 1 MHz, which may be switched to 10 MHz. Therefore Schmitt-Trigger 87 outputs a slow LOL signal, which declares LOL "reliably". The fast LOL signal output by Schmitt-Trigger 89 is less reliable and is used during lock acquisition as a signal to declare that lock has (probably) been achieved. The difference is only the amount of averaging applied. The LPF 86 is reset-able to ensure that it "restarts" with LOL clear when the PLL is locked.

Although the circuit of FIG. 11 has been described by kind of normalized signals, it is noted that, in a real implementation, 1 corresponds to 300 mV and −1 to −300 mV.

Selective Transitions Phase Detectors

So far, we have talked about early-late phase detectors that use only three samples to derive the timing information. The timing information can be improved when more than three samples are used. In principle, we can define arbitrary transitions at which the PDs generate information. In general, a selective transitions phase detector can be described by the vector defining the distance between samples (distance sample vector, DSV) and by the PD generator function (PDGF). When n samples are used the DSV is $$DSV(d_1=0,d_2,\ldots,d_n) \quad (5)$$

The first sample is placed at a location $d_1=0$, the next sample is taken from the location $d_1+d_2=d_2$, and the third one is located at $d_2+d_3$, and so on. For example, the DSV of the Alexander PD is defined as DSV(0,T/2,T/2) (cf. FIGS. 2 and 4). The PDGF has n inputs (samples values) and one output used for clock phase adjustment. There are $2^n$ possible input combinations for binary samples. The PDGF is a conceptual look-up table with n inputs ($2^n$ rows) so that $2^{k_1}$ combinations advance the clock phase, $2^{k_2}$ combinations delay the clock phase and rest of combinations do not cause any action ($n>k_1+k_2$).

The concept of selective transitions may be considered as a generalization of the Alexander phase detector rule shown in FIG. 2. Actually, an embodiment may comprise transition selectivity which is based on 5 samples as shown in FIGS. 15 and 16 as an option: Only "strong zero" to "strong one" transitions "00T11" (rising) and "11T00" (falling) transitions are used instead of the "0T1" and "1T0" transitions used by the Alexander PDR and PDF. Such transitions may be referred to as strong rising and strong falling transitions, respectively. Here the suggestive notation "00T11" for a rising edge detector means that the phase detector provides DOWN or UP outputs only for the five-sample sequences 00111 and 00011. In the parlance of DSV and PDGF, the DSV is (0,T/2,T/2,T/2,T/2) and the PDGF has two entries, 00111 and 00011. Such phase detector rules are even more specific than the Alexander phase detector and Alexander PDR and PDF.

The strong rising and falling phase detector rules shown in FIGS. 15 and 16 work well with the other elements of this application, but may be implemented without such elements and considered as a separate aspect of this invention. To this end a strong transition phase detector rule as illustrated in FIG. 14 may be defined in order reduce the circuit complexity resulting from differential phase control.

It is easy to explain, phase detectors evaluating strong transitions work well for dispersive channels. Strong ones, i.e. "11" and strong zeros, i.e. "00" are affected less by dispersion than isolated ones and isolated zeros. Consequently, phase detection based on strong transitions is more reliable. On the other hand, experiments and simulations show that alternating ones and zeros result in jitter, when using an Alexander PD.

A corner frequency of low-pass filter 116 of 0.2 times the symbol frequency has a similar effect: it reduces the influence of alternating ones and zeros and increases the influence of transitions between a sequence of ones and a sequence of zeros on the phase adjustment.

Symmetrical Phase Detectors

Early-late phase detectors suffer from a TEDC bias which shifts the whole TEDC function, thereby moving the equilibrium point. This bias very often cannot be removed even if more then three samples are used for timing information. The TEDC DC component can cause an additional jitter, and in some cases the VCO fails. The bias can be so high that a TEDC equilibrium point does not exist. This situation can be avoided by introducing so-called symmetry into the TEDC. Let us define offset TEDCs as $$TEDCo_R(\theta)=DC_R+\sin(\theta+\phi/2)$$

$$TEDCo_F(\theta)=DC_F+\sin(\theta-\phi/2), \quad (6)$$

where $DC_R$ and $DC_F$ correspond to the offset of the rising and falling TEDCs, respectively. The TEDC offset can be combatted by doubling the number of PDs and adding an adder for each pair of PDs and a delay circuit 92 as presented in FIG. 17. The delay circuit 92 delays the input signal 91 by T/2 equivalent to a phase shift of u and outputs a delayed signal 99. A first PD of each PD pair samples the input signal 91. A second PD of each PD pair samples the delayed signal 99. Since each PD of a PD pair samples a different signal, it may be said that each PD pair processes an input signal.

Figure 17:
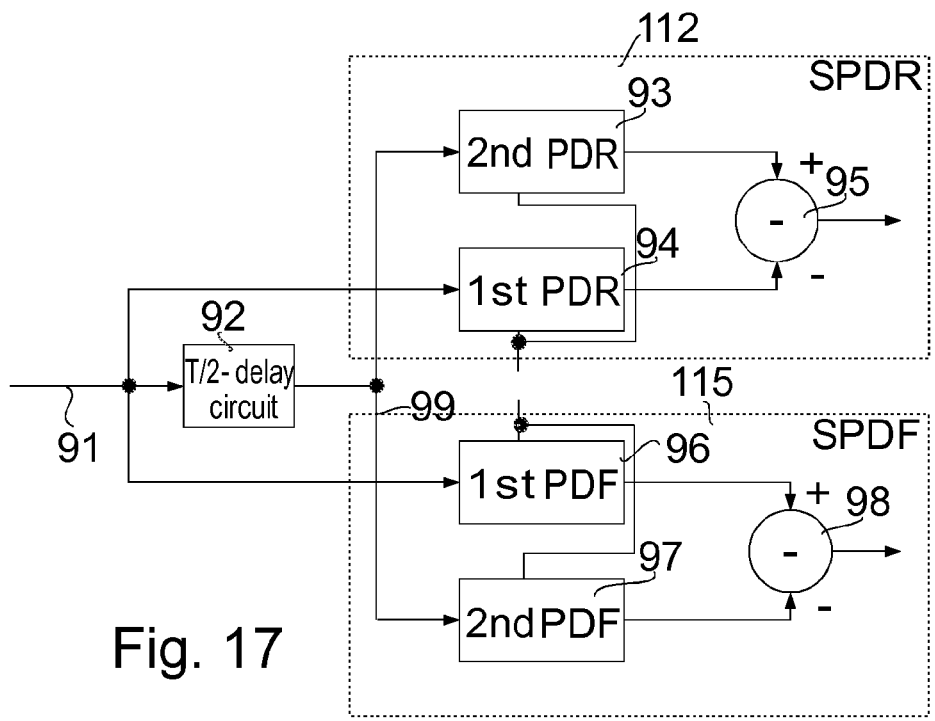
FIG. 17 shows a block diagram of a symmetrical phase detector.

FIG. 17 shows a symmetrical PDR (SPDR) 112 and a symmetrical PDF (SPDF) 115. SPDR 112 comprises a first PDR 94, a second PDR 93 and a subtractor 95 which subtracts the phase control signal of the first PDR 94 from the phase control signal of the second PDR 93. The output of subtractor 95 constitutes the phase control signal of SPDR 112. SPDF 115 comprises a first PDF 96, a second PDF 97 and a subtractor 98 which subtracts the phase control signal of the second PDF 97 from the phase control signal of the first PDF 96. The output of subtractor 98 constitutes the phase control signal of SPDF 115. Each PDR and PDF in FIGS. 9 and 10 may be replaced by a SPDR and SPDF, respectively. If each symmetrical PD is equipped with its own delay circuit, each symmetrical PD is pin-compatible with a simple, non-symmetrical PD.

$TEDC_R$ of SPDR 112 and $TEDR_F$ of SPDR 115 can then be written as $$TEDCs_R(\theta)=[DC_R+\sin(\theta+\phi/2)]-[DC_R-\sin(\theta+\phi/2)]=2\sin(\theta+\phi/2)$$

$$TEDCs_F(\theta)=[DC_F+\sin(\theta-\phi/2)]-[DC_F-\sin(\theta-\phi/2)]=2\sin(\theta-\phi/2) \quad (7)$$

Figure 18:
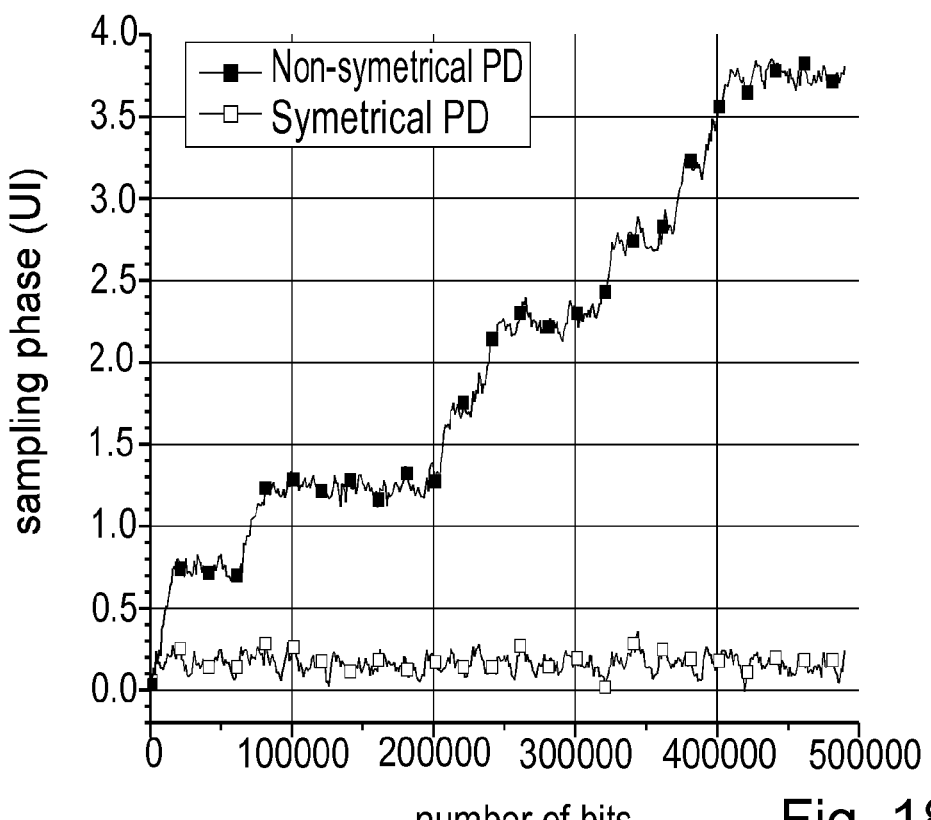
FIG. 18 shows the sampling phase of symmetrical and non-symmetrical phase detectors.

The advantage of a symmetrical PD (SPD) concept can be shown in FIG. 18. We present simulation results at extremely high residual dispersion of 11000 ps/nm with CML signal at OSNR of 24 dB. The 2-PD DPC circuit shown in FIG. 9 has been used for clock recovery. The sampling phase of the symmetrical PD is "stable" for a half of million bits. Significant jitter is noticeable but the phase varies within 25% of one unit interval (UI). The non-symmetrical PD generates clock cycles slips which are visible as a sampling phase drift by 4 UI.

Low-Pass Filter

Figure 19:
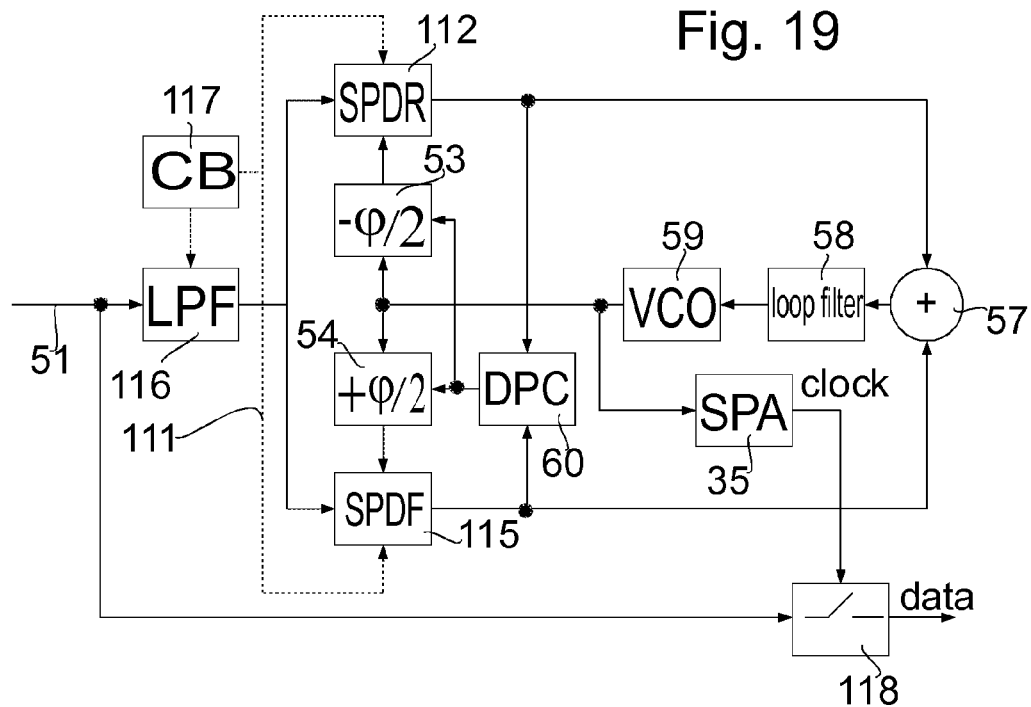
FIG. 19 shows an enhanced phase detector.

The CR performance in dispersive channels can be improved by implementing a low-pass filter 116 in front of the PD as shown in FIG. 19. The function of the low pass filter can be intuitively understood as noise-filtering and, for low cut-of frequencies, as edge smoothing, i.e. bringing steep edges and less steep edges closer together. The appropriate cut-off frequency of the LPF depends on the modulation format and the amount of distortion. For channels suffering from residual chromatic dispersion and PMD filter bandwidths of one fifth of the bit rate (1/T) can be useful. A cut-off frequency of 0.4 1/T can be interpreted as noise filtering, whereas a cut-off frequency of 0.2 1/T together with selectivity acts more like detecting the half-bitrate signal. It appears that 0.2 1/T is a good trade-off for a real implementation. The advantage of the LPF is demonstrated by the simulation results presented in FIGS. 20 and 21.

Enhanced CR Concept

Figure 7:
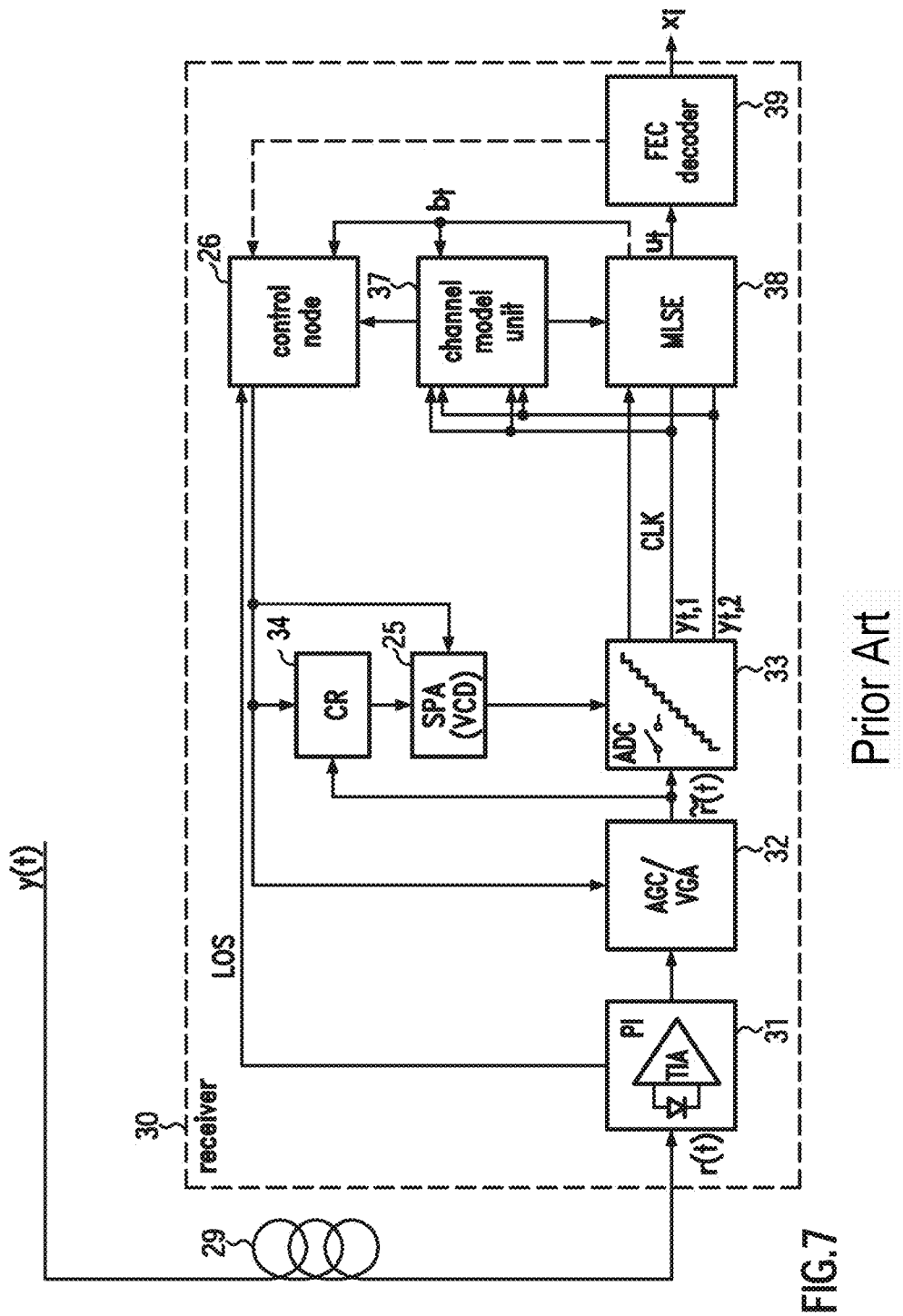
FIG. 7 shows a block diagram of a prior art optical receiver.

An enhanced CR concept summarizing innovative steps mentioned so far is shown in FIG. 19. A control block (CB) 117 adjusts the low-pass filter corner frequency of LPF 116 and selects the symmetrical phase detectors (selective transition phase detectors defined by DSV and PDGF). The LPF 116 outputs a filtered signal 111. As input the CB 117 uses information on the transmission: modulation format, amount and type of distortion, noise, etc. The SPA has to take into account the delay of the LPF 116. Sampler 118 may be similar to ADC 33 and consequently output quasi-analog data to an MLSE as shown in FIG. 7 or may make hard decisions outputting received data.

Simulation Results

Figure 20:
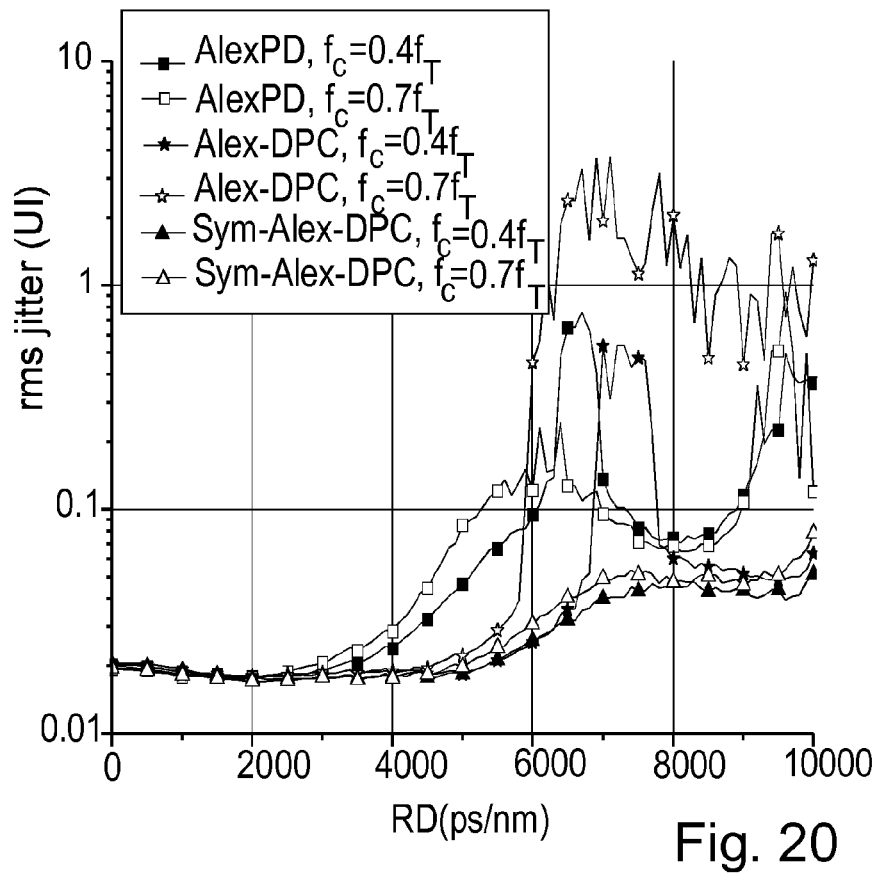
FIG. 20 shows simulation results for root-mean squared jitter for optical duo-binary modulation format.
Figure 21:
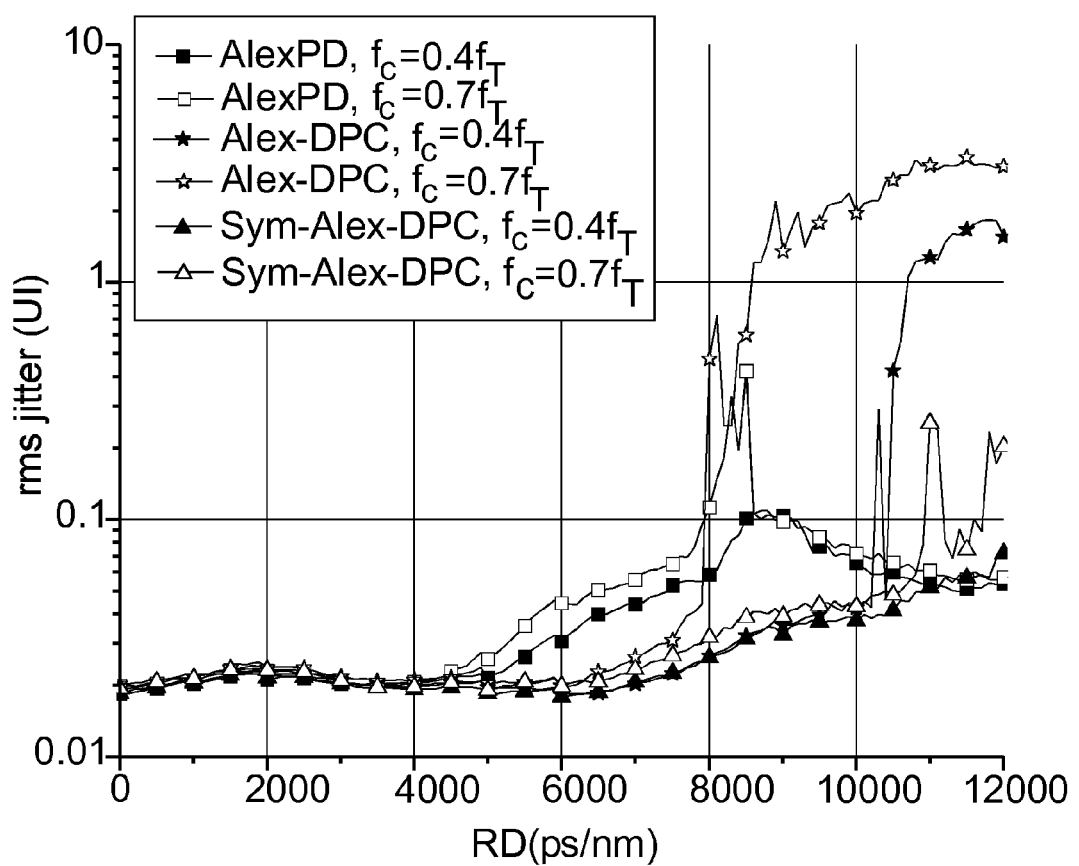
FIG. 21 shows simulation results for root-mean squared jitter for chirp managed laser modulation format.

We demonstrate the strength of the proposed method by presenting some simulation results. In FIGS. 20 and 21 we show root-mean squared (rms) jitter obtained by closed loop simulations. The simulations have been done with ODB and CML modulation formats. We have selected OSNR values for the range of residual chromatic dispersion that are acceptable for correct working of the MLSE receiver followed by an enhanced FEC (error correction capability approximately of $10^{-3}$). The symbol frequency was $f_T=10.7$ GHz/s, and the cut-off frequencies $f_c$ of low-pass filter 116 were 0.4 and 0.7 $f_T$. We have simulated three CR scenarios using:

Alexander phase detector (AlexPD) defined by FIG. 2

Alexander phase detector with DPC (Alex-DPC) with PDs (rising and falling) defined by FIG. 1, and Symmetrical Alexander phase detector-DPC (Sym-Alex-DPC) as shown in FIG. 19

The simulation results are presented in FIGS. 20 and 21 for the ODB and CML modulation formats, respectively. The LPF with a lower corner frequency ($f_c=0.4f_T$) improves the jitter performance of all three scenarios.

Comparing Alexander phase detector and Alexander phase detector-DPC we can see that the Alexander phase detector-DPC is superior. However, its performance is inferior for the ODB modulation format with RD between 7000 and 8000 ps/nm. The Sym-Alexander phase detector-DPC shows best performance. Introducing the TEDC symmetry improves CR performance in the critical RD regions of the Alexander phase detector-DPC. This is particularly important for the aforementioned critical ODB region, and for the CML modulation format at RD greater than 10000 ps/nm.

Further modifications and variations of the present invention will be apparent to those skilled in the art in view of this description. Accordingly, this description is to be construed as illustrative only and is for the purpose of teaching those skilled in the art the general manner of carrying out the present invention. It is to be understood that the forms of the

REFERENCE LIST

| | |
|---|---|
| 1, 2, 3 | sample |
| 4, 5 | phase control signal |
| 10 | Alexander phase detector |
| 11 | limiter |
| 12 | voltage source |
| 13, 14, 15, 16 | D-type monostable |
| 17 | KJ- flip-flop |
| 18, 19, 20 | XOR-gate |
| 21 | subtractor |
| 22, 23 | OR-gate |
| 24, 25 | AND-gate |
| 29 | optical channel |
| 30 | optical receiver |
| 31 | physical interface |
| 32 | AGC or VGA |
| 33 | analog-to-digital converter |
| 34 | clock recovery subsystem |
| 35 | sampling phase adjustment circuit |
| 36 | receiver control node |
| 37 | channel model unit |
| 38 | maximum likelihood sequence estimator |
| 39 | FEC decoder |
| 50 | differential clock-recovery circuit |
| 51 | input signal |
| 52 | (in-phase) rising phase detector |
| 53, 54 | adjustable phase shifter |
| 55 | (in-phase) falling phase detector |
| 57 | adder |
| 58 | loop filter |
| 59 | voltage-controlled oscillator |
| 60 | differential phase control lock |
| 61 | subtractor |
| 62 | integrator |
| 63, 64 | multiplier |
| 65, 66 | $\pi/2$-phase shifter |
| 67, 68 | low-pass filter |
| 69 | quadrature rising phase detector |
| 70 | quadrature falling phase detector |
| 71, 72 | comparator |
| 81 | adder |
| 82 | low-pass filter |
| 83 | sign circuit |
| 84 | adder |
| 85 | offset generator |
| 86, 88 | low-pass filter |
| 87, 89 | Schmitt-Trigger |
| 91 | input signal |
| 92 | T/2-delay circuit |
| 93, 94 | rising phase detector |
| 96, 97 | falling phase detector |
| 95, 98 | subtractor |
| 99 | delayed signal |
| 111 | filtered signal |
| 112 | symmetrical rising phase detector |
| 115 | symmetrical falling phase detector |
| 116 | low-pass filter |
| 117 | control block |
| 118 | sampler |

The invention claimed is:

1. A phase detection method comprising:
sampling an input signal in order to obtain several samples at different points in time with respect to a clock, said different points in time comprising an earliest point and latest point;
classifying a slope of a transition of the input signal into one out of two categories if a transition in the input signal between said earliest and latest point is detected, the two categories being a falling slope and a rising slope;
generating, based on said several samples of the input signal, a phase control signal being zero, positive or negative, wherein generating the phase control signal comprises:
performing a rising phase detection method and outputting a zero phase control signal if a falling slope is detected and otherwise outputting a non-zero phase control signal if a rising slope is detected and the rising slope is at least one of early or late with respect to said clock; or
performing a falling phase detection method and outputting a zero phase control signal if a rising slope is detected and otherwise outputting a non-zero phase control signal if a rising slope is detected and the rising slope is at least one of early or late with respect to said clock;
advancing the clock by a controllable phase angle thereby obtaining an advanced clock defining said different points in time for said rising phase detection method; and
delaying the clock by said controllable phase angle thereby obtaining a delayed clock defining said different points in time for said falling phase detection method.

2. The method of claim 1, wherein performing the rising phase detection method comprises performing a first rising phase detection method and a second rising phase detection method at different points in time with respect to the clock, and further comprising:
delaying a signal processed by said first rising phase detection method by $\pi$ to output a delayed input signal;
sampling said delayed input signal; and
subtracting a phase control signal produced by said first rising phase detection method from a phase control signal produced by said second rising phase detection method to produce a symmetrical rising phase control signal.

3. The method of claim 1, wherein performing the falling phase detection method comprises performing a first falling phase detection method and a second falling phase detection method at different points in time with respect to the clock, and further comprising:
delaying a signal processed by said first rising phase detection method to output a delayed input signal;
sampling said delayed input signal; and
subtracting a phase control signal produced by said second falling phase detection method from a phase control signal produced by said first falling phase detection method to produce a symmetrical falling phase control signal.

4. The method of claim 1, wherein the phase detection method evaluates five samples at a time and a phase control signal different from zero is output if the first two samples are zeros and the last two samples are ones or if the first two samples are ones and the last two samples are zeros.

5. The method of claim 1, further comprising obtaining said controllable phase angle comprising:
subtracting the phase control signal produced by said falling phase detection method from the phase control signal produced by said rising phase detection method for obtaining a difference signal;
integrating said difference signal to produce said controllable phase angle.

6. The method of claim 1,
wherein the rising phase detection method comprises a quadrature rising phase detection method;
wherein the falling phase detection method comprises a quadrature falling phase detection method;

delaying said advanced clock by π/2 thereby obtaining a second advanced clock which defines said different points in time for said quadrature rising phase detection method; and delaying said delayed clock by π/2 thereby obtaining a second delayed clock which defines said different points in time for said quadrature falling phase detection method.

7. The method of claim 6, further comprising:

multiplying said phase control signal produced by said rising phase detection method by said phase control signal produced by said quadrature falling phase detection method thereby obtaining a first product;

multiplying said phase control signal produced by said falling phase detection method by said phase control signal produced by said quadrature rising phase detection method thereby obtaining a second product; and subtracting the second product from the first product for obtaining said difference signal.

8. The method of claim 1, further comprising low-pass filtering said input signal with a low-pass filter thereby obtaining a filtered signal that is processed by one or more of the rising phase detection method and falling phase detection method.

9. The method of claim 8, wherein the low-pass filter has a corner frequency of 0.2 times a symbol frequency.

10. A phase detector comprising:

a sampler circuit configured to obtain several samples of an input signal at different points in time, said different points in time comprising an earliest point and latest point, said sampler circuit having an input terminal configured to receive said input signal and a clock terminal configured to receive a clock for defining said points in time;

output circuitry configured to output a phase control signal obtained from said several samples such that said phase control signal being zero, positive or negative, said output circuitry being electrically connected to said sampler circuit for receiving said samples and having a phase control terminal for outputting said phase control signal;

classifying circuitry configured to detect transitions and classify a slope of a transition into one out of two categories if a transition in the input signal between said earliest and latest point is detected, the two categories being a falling slope and a rising slope;

said output circuitry comprising:

a rising phase detector configured to output a zero phase control signal if a falling slope is detected and a non-zero phase control signal if a rising slope is detected and the rising slope is at least one of early or late with respect to said clock; or a falling phase detector configured to output a zero phase control signal if a rising slope is detected and a non-zero phase control signal if a rising slope is detected and the rising slope is at least one of early or late with respect to said clock, wherein the input terminals of said rising and falling phase detectors are electrically connected;

a negative adjustable phase shifter having a clock input terminal and a clock output terminal, said negative adjustable phase-shifter for advancing the clock received at its clock input terminal by a controllable phase angle and thereby obtaining an advanced clock at its clock output terminal which is electrically connected to a clock terminal of said rising phase detector;

a positive adjustable phase shifter having a clock input terminal and a clock output terminal, said positive adjustable phase-shifter for delaying the clock received at its clock input terminal by said controllable phase angle and outputting said delayed clock at its clock output terminal which is electrically connected to a clock terminal of said falling phase detector.

11. The phase detector of claim 10, comprising:

a first rising phase detector;

a second rising phase detector;

clock terminals of said first and second rising phase detectors being electrically connected;

a phase shifter having an input and an output, the input of said phase shifter being electrically connected to said input terminal of said second rising phase detector for receiving said input signal, said phase shifter configured to output a delayed input signal and having an output electrically connected to said input terminal of said first rising phase detector; and a subtractor circuit having a positive input electrically connected to a phase control terminal of said first rising phase detector and a negative input electrically connected to a phase control terminal of said second rising phase detector, said subtractor circuit further having an output constituting a symmetrical rising phase control terminal.

12. The phase detector of claim 10, further comprising:

a first falling phase detector;

a second falling phase detector;

clock terminals of said first and second falling phase detectors being electrically connected;

a phase shifter having an input and an output, the input of said phase shifter being electrically connected to said input terminal of said first falling phase detector for receiving said input signal; said phase shifter configured to output a delayed input signal and having an output electrically connected to said input terminal of said second falling phase detector; and a subtractor circuit having a positive input electrically connected to a phase control terminal of said first falling phase detector and having a negative input electrically connected to a phase control terminal of said second falling phase detector, said subtractor circuit further having an output constituting a symmetrical falling phase control terminal.

13. The phase detector of claim 10, further comprising a differential phase control block which comprises a subtractor circuit and an integrator, said subtractor circuit having a positive input electrically connected to a phase control terminal of said rising phase detector and a negative input electrically connected to a phase control terminal of said falling phase detector said subtractor circuit having an output electrically connected to an input of said integrator and an output of said integrator being electrically connected to a control terminal of each of said negative and positive adjustable phase shifters.

14. The phase detector of claim 10, wherein the rising phase detector comprises a quadrature rising phase detector;

wherein the falling phase detector comprises a quadrature falling phase detector, the input terminals of said quadrature rising phase detector, said quadrature falling phase detector, said rising phase detector and said falling phase detector being electrically connected for receiving said input signal;

a first phase shifter having an input and output, said input of said first phase shifter being electrically connected to said clock output terminal of said negative adjustable phase-shifter and said output of said first phase shifter being electrically connected to said clock terminal of said quadrature rising phase detector; said first phase shifter configured to delay said advanced clock by π/2; and a second phase shifter having an input and output, said input of said second phase shifter being electrically connected to said clock output terminal of said positive adjustable phase-shifter, said output of said second phase shifter being electrically connected to said clock terminal of said quadrature falling phase detector, said second phase shifter configured to delay said delayed clock by π/2.

15. The phase detector of claim 14, further comprising:

a first multiplier having a first and a second input and an output, said first input of said first multiplier being electrically connected to a phase control terminal of said rising phase detector and said second input of said first multiplier being electrically connected to a phase control terminal of said quadrature falling phase detector; said output of said first multiplier being electrically connected to said positive input of said subtractor circuit; and a second multiplier having a first and a second input and an output, said first input of said second multiplier being electrically connected to a phase control terminal of said falling phase detector and said second input of said second multiplier being electrically connected to a phase control terminal of said quadrature rising phase detector, said output of said second multiplier being electrically connected to said negative input of said subtractor circuit.

16. The phase detector of claim 14, further comprising:

an adder circuit having two inputs, one input of said adder circuit being electrically connected to said quadrature rising phase detector, the other input of said adder circuit being connected to said quadrature falling phase detector;

a low-pass filter having an input and an output, said input of said low-pass filter being connected to an output of said adder circuit; and a comparator having an input and an output, said input of said comparator being electrically connected to said output of said low-pass filter and said comparator outputting a loss-of-lock signal.

17. The phase detector of claim 10, further comprising a low-pass filter having an input and an output, the input of said low-pass filter for receiving said input signal and said output of said low-pass filter being electrically connected to said input terminal of said sampler circuit.

18. A method comprising:

sampling an input signal in order to obtain several samples at different points in time with respect to a clock, said different points in time comprising an earliest point and latest point;

classifying a slope of a transition of the input signal into one out of two categories if a transition in the input signal between said earliest and latest point is detected, the two categories being a falling slope and a rising slope;

generating, based on said several samples of the input signal, a phase control signal being zero, positive or negative, wherein generating the phase control signal comprises:

performing a first rising phase detection method and a second rising phase detection method at different points in time with respect to the clock so as to output a zero phase control signal if a falling slope is detected and otherwise output a non-zero phase control signal if a rising slope is detected and the rising slope is at least one of early or late with respect to said clock and further comprising:

delaying a signal processed by said first rising phase detection method by π to output a delayed input signal, sampling said delayed input signal, and subtracting a phase control signal produced by said first rising phase detection method from a phase control signal produced by said second rising phase detection method to produce a symmetrical rising phase control signal, or performing a falling phase detection method and outputting a zero phase control signal if a rising slope is detected and otherwise outputting a non-zero phase control signal if a rising slope is detected and the rising slope is at least one of early or late with respect to said clock.

19. The method of claim 18, wherein performing the falling phase detection method comprises performing a first falling phase detection method and a second falling phase detection method at different points in time with respect to the clock, and further comprising:

delaying a signal processed by said first rising phase detection method to output a delayed input signal;

sampling said delayed input signal; and subtracting a phase control signal produced by said second falling phase detection method from a phase control signal produced by said first falling phase detection method to produce a symmetrical falling phase control signal.

20. The method of claim 18, and further comprising:

advancing the clock by a controllable phase angle thereby obtaining an advanced clock defining said different points in time for said rising phase detection method;

delaying the clock by said controllable phase angle thereby obtaining a delayed clock defining said different points in time for said falling phase detection method.

* * * * *